United States Patent

Wang et al.

[11] Patent Number: 6,066,873
[45] Date of Patent: May 23, 2000

[54] METHOD AND APPARATUS FOR PREVENTING P1 PUNCHTHROUGH

[75] Inventors: John J. Wang; Yuesong He, both of San Jose; Kent Kuohua Chang, Cupertino, all of Calif.

[73] Assignee: Advanced Micro Devices, Inc., Sunnyvale, Calif.

[21] Appl. No.: 09/271,330

[22] Filed: Mar. 18, 1999

Related U.S. Application Data

[62] Division of application No. 09/002,783, Jan. 5, 1998, Pat. No. 5,972,749.

[51] Int. Cl.⁷ .................................................. H01L 39/78
[52] U.S. Cl. ........................................... 257/315; 257/316
[58] Field of Search ..................................... 257/315, 316

[56] References Cited

U.S. PATENT DOCUMENTS

| | | | |
|---|---|---|---|
| 4,958,321 | 9/1990 | Chang | 365/185 |
| 5,010,039 | 4/1991 | Ku et al. | 438/702 |
| 5,172,200 | 12/1992 | Muragishi et al. | |
| 5,409,854 | 4/1995 | Bergemont | |
| 5,481,494 | 1/1996 | Tang et al. | 365/185.24 |
| 5,482,881 | 1/1996 | Chen et al. | 437/43 |
| 5,550,072 | 8/1996 | Cacharelis et al. | 438/201 |
| 5,553,018 | 9/1996 | Wang et al. | 365/185.01 |
| 5,561,620 | 10/1996 | Chen et al. | 365/218 |
| 5,574,685 | 11/1996 | Hsu | 365/185.18 |
| 5,579,261 | 11/1996 | Radjy et al. | 365/185.33 |
| 5,591,658 | 1/1997 | Cacharelis | 438/264 |
| 5,595,924 | 1/1997 | Yuan | 438/587 |
| 5,672,892 | 9/1997 | Ogura et al. | |
| 5,686,332 | 11/1997 | Hong | 438/261 |

*Primary Examiner*—Stephen D. Meier
*Attorney, Agent, or Firm*—Foley & Lardner

[57] ABSTRACT

A method and apparatus for an integrated circuit on a semiconductor substrate having good metal contact points. A first polysilicon layer is formed onto the substrate, and is etched to provide contact regions to the substrate. An ONO layer is formed onto the first polysilicon layer. A second polysilicon layer is formed onto the ONO layer, and a metal silicide layer is formed onto the second polysilicon layer. The second polysilicon layer and the metal silicide layer are etched at particular locations in order to form contact regions to the first polysilicon layer and to the substrate. A selective layer is formed onto the second polysilicon layer, the selective layer being etch selective with respect to the first polysilicon layer. An interlayer dielectric is formed onto the selective layer. A first etching is performed to provide a contact path through the interlayer dielectric, and then a second etching is performed to provide a contact path through the selective layer. Based on these two contact paths, a contact point can be provided externally to the first polysilicon layer.

4 Claims, 4 Drawing Sheets

METHOD AND APPARATUS FOR PREVENTING P1 PUNCHTHROUGH

This application is a divisional of application Ser. No. 09/002,783, filed Jan. 5, 1998 now U.S. Pat. No. 5,972,749.

BACKGROUND OF THE INVENTION

1. Field of the Invention

The present invention relates to a method and apparatus for preventing P1 punchthrough by using a film that is highly selective to P1 with respect to a particular etch chemical used. In particular, the present invention relates to a method and apparatus for providing a good contact to a first polysilicon layer formed on a semiconductor substrate.

2. Description of the Related Art

When constructing a RAM cell using a semiconductor substrate, metal contacts must be provided to each layer formed on the substrate. For example, a metal-oxide-semiconductor (MOS) transistor formed on the semiconductor substrate has a gate region, a source region, and a drain region. A metal contact must be provided to each of these regions, so that the appropriate voltage and/or current can be supplied to the gate, source and drain of the MOS transistor.

Given the small size of such devices, there is not much leeway in providing such contacts, and any errors in this process may lead to defective components. For example, an etch to a particular layer may be performed for too long a period of time, thereby etching through a desired layer to be contacted with, and instead contacting with another layer that has a different function than the desired layer.

FIGS. 1A–1H show a conventional process for creating a RAM memory cell on a semiconductor substrate. In a first step, as shown in FIG. 1A, a thin layer of insulator is formed over the silicon substrate 10. This insulator layer 12 may conveniently comprise a thermally grown $SiO_3$, and is typically referred to as a pad oxide layer. As shown in FIG. 1A, another insulator layer is formed over the insulator layer 12, and serves as a second insulator layer 14 that functions as an oxidation mask. By way of example, this second different insulator layer 14 may comprise a nitride layer formed by means of a chemical vapor deposition (CVD) process.

Referring now to FIG. 1B, the semiconductor structure is shown with a patterned photo-resist layer 16 formed thereon. The resist pattern is used to protect the areas where active devices will be formed. This patterning may be accomplished by means of standard lithography and etching techniques that are well known in the art.

Referring now to FIG. 1C, the semiconductor structure is shown after an etching step and a photo-resist clean step. The etching step operates to remove all of the nitride layer 14 that is exposed, i.e., that is not covered or protected by the photo-resist pattern 16 of FIG. 1B.

Referring now to FIG. 1D, a field oxide region 18 is grown, by way of example, by a thermal growth process using wet oxidation, in the exposed areas of the layer 12, i.e., those areas of the layer 12 which are not covered by the nitride pattern 14. A typical field oxide region may rise above the surface of the surrounding semiconductor area by about 1000 to 4000 angstroms. The field oxide region 18 provide isolation between separate components (i.e., transistors) formed on the same semiconductor substrate.

Referring now to FIG. 1E, the nitride pattern 14 is removed by means of a nitride clean step, and a thin tunnel oxide layer 20 is formed over the semiconductor substrate including the field oxide region 18. This thin oxide layer 20 may be formed utilizing standard thermal growth techniques in an oxidation ambient. In a preferred embodiment, this oxide layer 20 may be on the order of 100 angstroms. Following the formation of this oxide layer 20, a conductive polysilicon layer 22 is deposited thereover, by way of example, by a CVD process. The polysilicon layer (P1 layer) 22 may be amorphous polysilicon and may include doping, or doping may be added after deposition to provide a desired conductivity. A typical conductivity for the P1 layer 22, which is set forth by way of example, and not by way of limitation, is 400 ohms per square. The P1 layer 22 typically will be deposited to a thickness on the order of 500–1000 angstroms. The P1 layer 22 corresponds to a layer that stores electrons, such as for storing a binary "1" value for a RAM memory cell. The electrons can be removed from the P1 layer 22, thereby erasing the RAM cell (i.e., creating a "0" value in the RAM memory cell).

The polysilicon layer deposition step is then followed by an etching step to form openings 24 through the P1 layer 22 down to the field oxide layer 18. In a preferred embodiment, these openings are formed by directionally etching the top surface of the doped P1 layer 22 after masking, using standard photo-lithographic techniques. Such photo-lithographic masking techniques are well known in the art and include, by way of example, disposing an insulator of $SiO_2$ or some other etch-resistant material on the top surface of the material to be etched. This $SiO_2$ layer may be deposited or grown by any known means in the art, such as by oxidizing the P1 layer 22 in steam or in wet oxygen. A portion of the insulating layer of $SiO_2$ is removed using a photo-resist layer selectively exposed to UV radiation and then developed chemically to act as a mask for the $SiO_2$. The masked $SiO_2$ may then be etched with a buffered hydrofluoric acid solution, for example, leaving a remaining portion of the $SiO_2$ layer above the polysilicon surface in a desired pattern. Then, a directional etch is utilized to form trenches with vertical sidewalls in areas of polysilicon not covered by the patterned $SiO_2$ mask. Typical chemical directional etches are $SF_6CCLF_2$ in a plasma-form. The etching process is performed for a particular period of time based on the thickness of the layer-to-be-etched, and any deviation from that time may result in too little etching or too much etching. Other variables that enter into the etching process are the particular environmental conditions that exist during the etch, which should be maintained in a fairly precise range. The result of the directional etching process are openings having sidewalls that are substantially vertical.

Referring now to FIG. 1F, the semiconductor structure is shown after an ONO process and the deposition of a second layer of polysilicon. Specifically, the ONO layer 26 may be formed, by way of example, by forming a first layer of oxide by means of a thermal growth process, forming a second layer of nitride by means of chemical vapor deposition, and forming a third layer of oxide by means of chemical vapor deposition. By way of example, but not by way of limitation, this layer 26 may be on the order of 160 angstroms.

Following the deposition of ONO isolation layer 26, a second layer of polysilicon (P2 layer) 28 is deposited in a well-known manner, such as by a CVD process. The P2 layer 28 may have a thickness on the order of 1200 angstroms. The P2 layer 28 should have a higher doping level than the P1 layer 22. This doping to obtain the desired conductivity may be accomplished during the layer deposition phase or after the deposition of the polysilicon layer. The P2 layer 22 corresponds to a control gate, and when a particular voltage is applied to the P2 layer 22, electrons are either supplied to the P1 layer 22 or removed from the P1 layer 22. Thus, the P2 layer 22 may be used to program a memory cell when the semiconductor device is configured as a RAM.

After the P2 layer 28 is formed on the substrate, an etching process is performed to provide "holes" through which contacts may be made to lower layers on the substrate, such as the P1 layer 22. For example, the techniques described above with respect to patterning the P1 layer 22 may be utilized to pattern the P2 layer 28 so as to form openings to provide contact regions to lower level layers (such as the P1 layer 22). Such a formation of holes in the P2 layer 28 is needed when the P1 layer and the P2 layer 28 are in a same direction (i.e., in a plane going into the paper in FIGS. 1A–1H), and is generally not needed when the P1 layer 22 and the P2 layer 28 are formed in different directions (i.e. direction of P1 layer 22 perpendicular to P2 layer 28).

After the P2 layer 28 has been deposited onto the semiconductor structure and patterned (and after any doping has been applied to that second layer of polysilicon 28), a metal silicide layer, for example, $WSi_x$ (x=2 or 4), is deposited onto the semiconductor structure, for example, with silane gas. Other types of metals, such as tantalum, palladium, molybdenum, may be utilized instead of tungsten, as is known to those of ordinary skill in the art. As shown in FIG. 1G, the metal silicide layer 33 and the P2 layer 28 are patterned via standard lithography techniques to form openings 40 so as to provide contact regions to lower layers, such as to the P2 layer 28, the P1 layer 22, and to the silicon substrate itself. During the patterning of the P2 layer 28, portions of the ONO isolation layer 26 underneath the patterned P2 layer 28 will also be etched away. The patterning of the P1 layer 22 and the P2 layer 28 is such that there are provided openings in the P2 layer 28 to provide a contact region to the P1 layer 22, and there are provided openings in both the P1 layer 22 and the P2 layer 28 that are coplanar so as to provide a contact region to the silicon substrate.

Thereafter, an interlayer dielectric (ILD) 38 is deposited onto the semiconductor structure. After the ILD layer 38 is deposited, it is polished to a substantially uniform thickness. For example, the ILD layer 38 may be polished to a thickness of approximately 1.1 microns. Afterwards, a dry plasma etch is utilized to pattern the ILD layer 38 so as to form openings 50A, 50B and 50C in the ILD layer 38 so as to provide contact regions to lower layers on the semiconductor substrate, as shown in FIG. 1H. Such a dry plasma etch may involve, for example, using a photoresist and placing the semiconductor substrate in a mixed gas environment using $C_4F_8$ and $O_2$, to thereby etch away portions of the oxide where desired.

For a RAM device, a word line is provided to the P2 layer, via a metal contact. Also, a word select line is provided to the P1 layer, via another metal contact. Both metal contacts must be applied to the correct layer on the substrate, requiring a fairly accurate etching process to reach the appropriate layer on the substrate. For example, when etching down to the P1 layer, it is possible that the etch may go too far, thereby etching all the way through the P1 layer and to the semiconductor substrate itself. This "P1 punch-through" is highly undesirable, and leads to a defective device.

It is preferable to etch to the top surface of the P1 layer, to provide a best possible contact point to that layer. However, the etching process may be such that the etch is made to a middle location in the P1 layer, thereby not providing the best possible metal contact point to that layer.

Therefore, it is desirable to construct a semiconductor device that allows for fairly accurate etching to the appropriate layer, so as to provide strong and stable metal contact points to the P1 layer.

SUMMARY OF THE INVENTION

An object of the present invention is to provide a semiconductor device that provides for accurate formation of metal contact points to a P1 layer.

The above-mentioned object may be achieved by a semiconductor device having a P1 layer formed on a semiconductor substrate. An ONO layer is formed on the P1 layer. A P2 layer is formed on the ONO layer, and a metal silicide layer is formed on the P2 layer. A layer that is selective to the P1 layer is then formed on the metal silicide layer. When a metal contact is made to the P1 layer using a particular etching process, the particular etching process etches through the selective layer, but does not etch into the P1 layer, thereby providing a good contact to the P1 layer. That is, from an etch point of view, the selective layer is very much different from the P1 layer.

BRIEF DESCRIPTION OF THE DRAWINGS

The above-mentioned objects and advantages of the invention will become more fully apparent from the following detailed description when read in conjunction with the accompanying drawings, with like reference numerals indicating corresponding parts throughout, and wherein.

DETAILED DESCRIPTION OF THE PREFERRED EMBODIMENT

The present invention will be discussed in detail below with reference to the drawings.

Figure 1A:
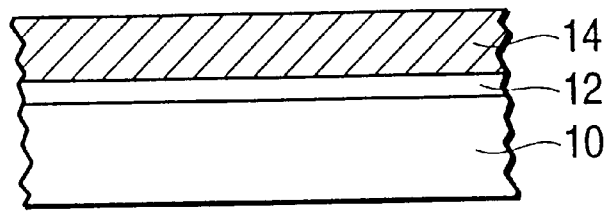
FIGS. 1A–1H show steps involved in the formation of a semiconductor substrate according to a conventional process.
Figure 1B:
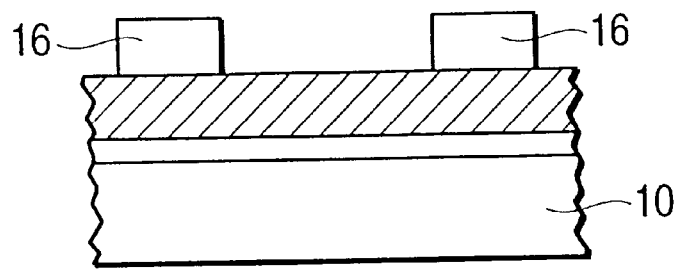
Figure 1C:
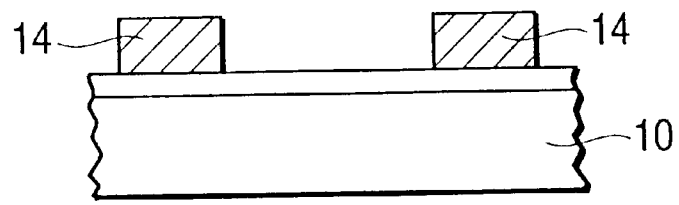
Figure 1D:
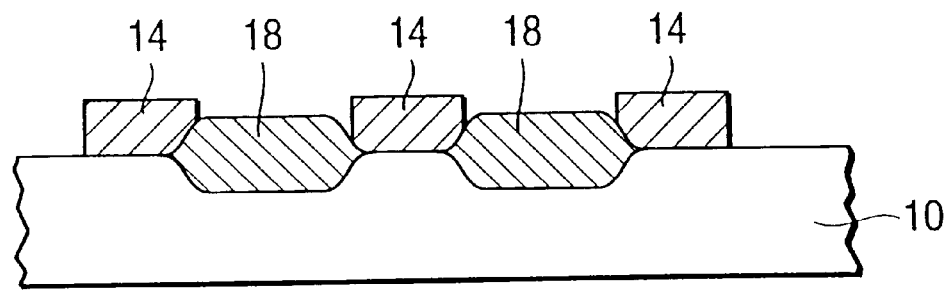
Figure 1E:
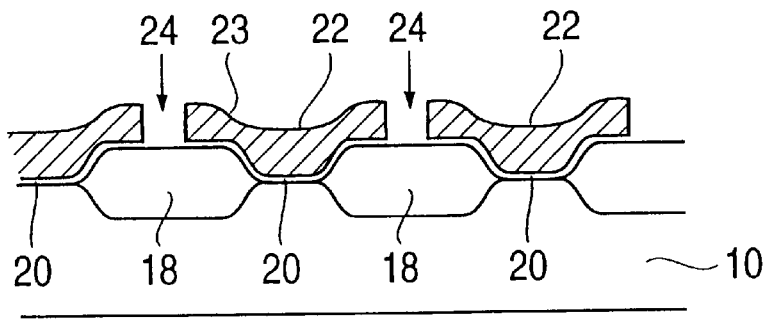
Figure 1F:
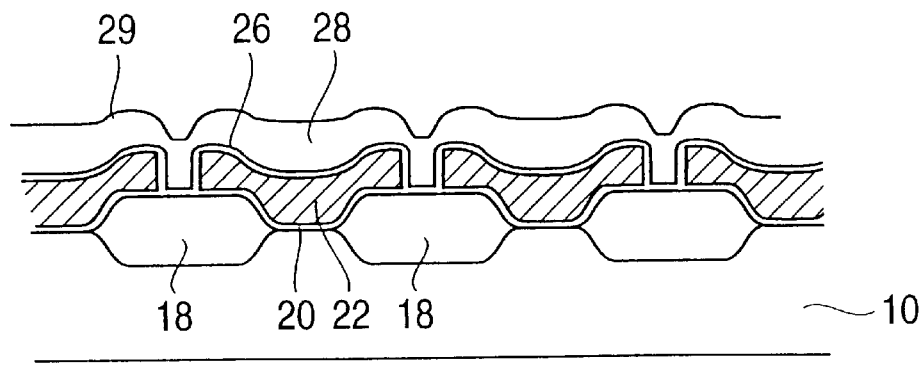
Figure 1G:
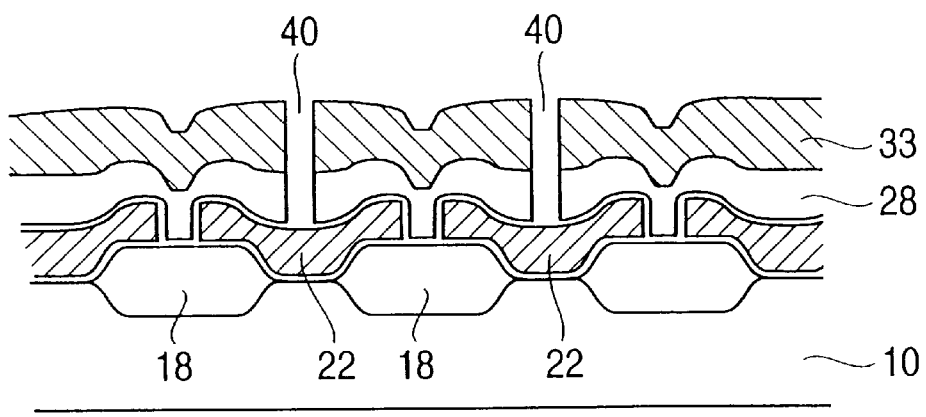
Figure 1H:
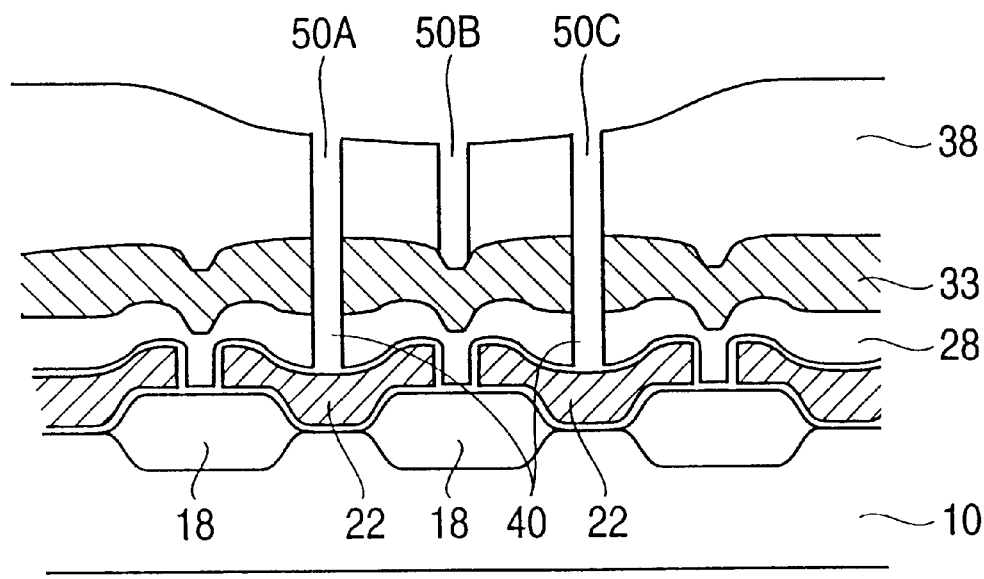
Figure 2:
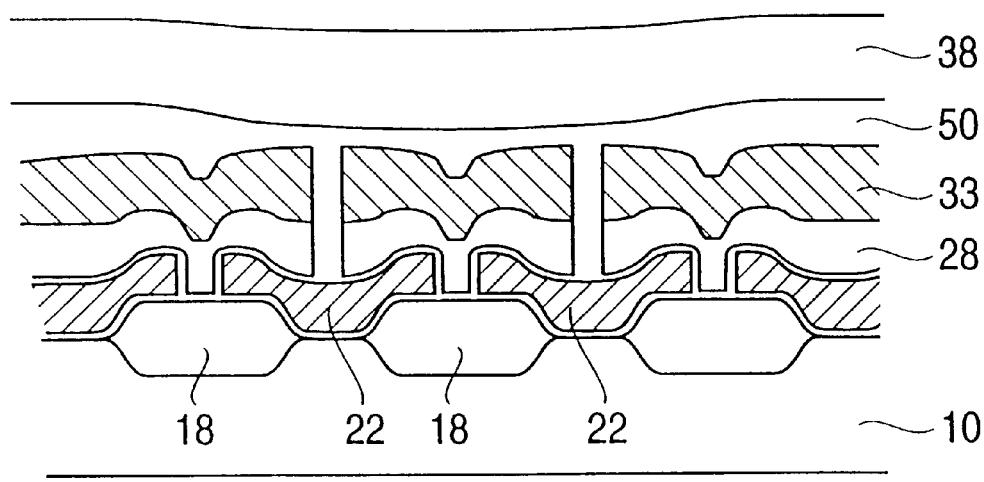
FIG. 2 shows the structure of a semiconductor substrate formed according to a preferred embodiment of the invention.

FIG. 2 shows the structure of a semiconductor device formed according to a preferred embodiment of the invention, prior to any etching of the ILD layer 38 and the selective layer 50. While the description is made with respect to a RAM cell, it can be equally applied to other types of devices, such as logic gates, which require metal contacts to lower level layers on a semiconductor substrate.

The apparatus and method according to the invention follows the steps and structure as given in FIGS. 1A–1H, as in the conventional apparatus and method, but with an additional step. In the present invention, after the P2 layer 28 and the $WSi_x$ layer have been deposited and patterned, a selective layer 50 is applied to the substrate. The selective layer 50 is a film that is highly selective to the P1 layer 22, with respect to a particular etch technique utilized. In the preferred embodiment, the selective layer 50 is a silicon nitride layer, $Si_xN_y$, and the particular etch technique utilized is a dry plasma etch using a mixed gas environment with $CH_3F$ and $O_2$.

In the present invention, after the ILD layer 38 has been deposited onto the semiconductor structure and polished to a substantially uniform thickness, portions of the ILD layer 38 are etched down to a top surface of the selective layer 50. The etching of the ILD layer 38 is performed using a photo-resist and a dry plasma etch in a mixed gas environment, preferably with the gases being $C_4F_8$ and $O_2$. Such a mixture of gases used in a dry plasma etch is not highly selective to the P1 layer 22, and so in the conventional scheme that does not have a selective layer 50, the etching of the ILD layer 38 may result in some unwanted etching into the P1 layer 22. This may occur if the enviromental conditions during the etch process change, or if some other variables change during the etch process (concentration of gases used, pressure, etc.). With the use of a second etch, which etches through the selective layer 50 and stops substantially at the top surface of the P1 layer 22, a good contact point can be provided to the P1 layer 22.

The second etch is preferably a dry plasma etch in a mixed gas environment, using $CH_3F$ gas and $O_2$ gas, or equivalent. Such a mixed gas used in a dry plasma etch is highly selective to the P1 layer 22, and thus will not etch very much into that layer, but will readily etch through the selective layer 50. Thus, even if the environmental conditions change during the etching to provide the contact points to the P1 layer 22, this will not result in a problem, since the contact points will still be substantially provided to the top surface of the P1 layer 22, will very little if any etching into the P1 layer 22.

In the preferred embodiment, the selective layer 50 has a thickness of approximately 2000 angstroms, and is a silicon-nitride based layer, $Si_xN_y$, where x and y are integers (for example, $SiN_2$). The value of x and y may vary based on the mixture and concentration of the $CH_3F$ and $O_2$ gases used during the etching of the layer 50, and may be adjusted to provide the best possible etch selectively between the P1 layer 22 and the selective layer 50 to suit current environmental conditions during a semiconductor fabrication process.

One of ordinary skill in the art will recognize that other types of layers may be utilized for the layer 50 in the system and method according to the invention, as long a particular etch technique is used that is highly selective to the P1 layer 22 (i.e., does not etch very much into the P1 layer 22), but which will readily etch through the selective layer 50 to provide a good contact point to the P1 layer 22.

Figure 3A:
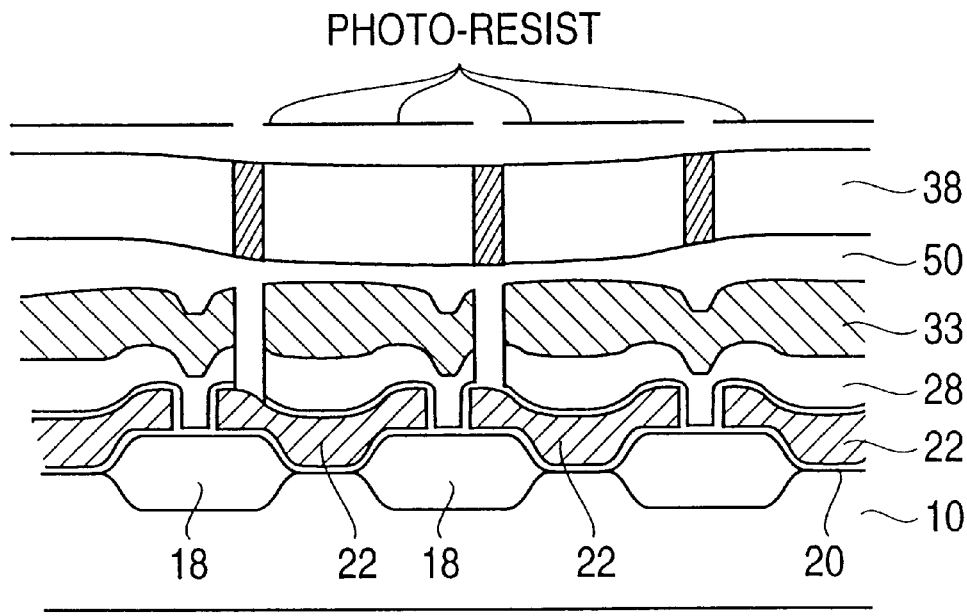
FIGS. 3A and 3B respectively show the semiconductor substrate formed according to the invention, after a first etching of the ILD layer and a second etching of the selective layer.
Figure 3B:
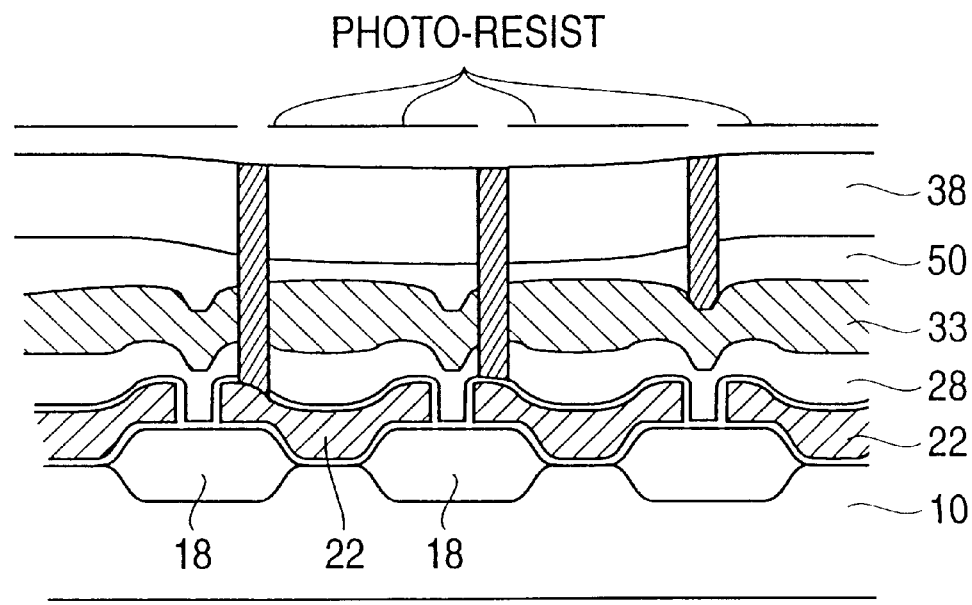

FIG. 3A shows the structure of a semiconductor device formed according to the invention after a first etch of the ILD layer 38, using a dry plasma etch such as one using a mixture of gases $C_4F_8$ and $O_2$. The etched area in the ILD layer 38 is shown as a double-hatched region in FIG. 3A. FIG. 3B shows the structure of the semiconductor device formed according to the invention after a second etch of the selective layer 50, using a dry plasma etch such as one using a mixture of gases $C_4F_8$ and $O_2$. The etched area in the selective layer 50 is shown as a double-hatched region in FIG. 3B.

The P1 and P2 contact regions are formed by providing a photo-resist to portions of the ILD layer 38 that are not to be etched. After the second etch is performed, using an etching process that is highly resistant to the P1 layer 22, a contact point is provided to a point that is on or substantially close to the top surface of the P1 layer 22.

While a preferred embodiment has been described herein, modification of the described embodiment may become apparent to those of ordinary skill in the art, following the teachings of the invention, without departing from the scope of the invention as set forth in the appended claims. For example, a particular wet etch that is selective to the P1 layer 22 but not to the layer 50 may be utilized instead of a dry etch, but this will provide a more isotropic etch (i.e., horizontally as well as vertically), which is not a desirable feature in the formation of metal contact regions.

The preferred embodiment of the present invention has been described for a semiconductor device that is used in RAM chip formation, such as in creating contacts between memory cells and word lines/word select lines. One of ordinary skill in the art will recognize that the present invention is also applicable to the formation of contact points for semiconductor devices suitable for other uses besides memories, such as for creation of logic devices, such as gates, flip-flops, multiplexers, etc.

What is claimed is:

1. An integrated circuit disposed on a semiconductor substrate, comprising:

a first polysilicon layer disposed on a top surface of the substrate, the first polysilicon layer having openings to provide contact points to the substrate;

an ONO layer disposed on the first polysilicon layer, the ONO layer providing isolation for the first polysilicon layer;

a second polysilicon layer disposed on the ONO layer, the second polysilicon layer having openings to provide contact points to the first polysilicon layer and to the substrate;

a selective layer disposed on the second polysilicon layer, the selective layer being a silicon nitride layer; and an interlayer dielectric disposed on the selective layer.

2. The apparatus according to claim 1, wherein the selective layer is approximately 2000 angstroms in thickness.

3. The apparatus according to claim 1, wherein the interlayer dielectric has at least one substantially vertical channel region formed therein due to an etching of the interlayer dielectric using a first etch technique, and wherein the selective layer has at least one substantially vertical channel region formed therein due to an etching of the selective layer using a second etch technique that is highly selective to the first polysilicon layer.

4. The apparatus according to claim 1, wherein the selective layer is a silicon nitride layer, $Si_xN_y$, where x and y are integers.

* * * * *